(12) United States Patent
Do

(10) Patent No.: US 7,450,448 B2
(45) Date of Patent: Nov. 11, 2008

(54) SEMICONDUCTOR MEMORY DEVICE

(75) Inventor: Chang-Ho Do, Ichon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 166 days.

(21) Appl. No.: 11/321,877

(22) Filed: Dec. 30, 2005

(65) Prior Publication Data
US 2006/0245284 A1 Nov. 2, 2006

(30) Foreign Application Priority Data
Apr. 30, 2005 (KR) .................. 10-2005-0036593

(51) Int. Cl.
*G11C 7/00* (2006.01)
(52) U.S. Cl. .................. 365/196; 365/207; 365/205; 365/194
(58) Field of Classification Search ............ 365/189.05, 365/189.07, 189.08, 180.09, 189.11, 194, 365/196, 205, 207
See application file for complete search history.

(56) References Cited

U.S. PATENT DOCUMENTS

| | | | |
|---|---|---|---|
| 5,155,397 A * | 10/1992 | Fassino et al. ............. 327/54 |
| 5,764,580 A * | 6/1998 | Suzuki et al. ............. 365/205 |
| 6,043,685 A | 3/2000 | Lee | |
| 6,477,100 B2 | 11/2002 | Takemura et al. | |
| 6,774,709 B2 * | 8/2004 | Castaldo et al. ............. 327/536 |
| 6,853,593 B1 | 2/2005 | Bae | |
| 6,915,251 B2 | 7/2005 | Becker | |
| 2005/0002251 A1 | 1/2005 | Takemura et al. | |
| 2005/0013175 A1 | 1/2005 | Bae | |

FOREIGN PATENT DOCUMENTS

| | | |
|---|---|---|
| JP | 10-302467 | 11/1998 |
| JP | 2002-230975 | 8/2002 |
| JP | 2003-242780 A | 8/2003 |
| KR | 1999-0066047 | 8/1999 |
| KR | 10-2005-0009012 | 1/2005 |
| KR | 10-2005-0078998 | 8/2005 |

* cited by examiner

*Primary Examiner*—Richard Elms
*Assistant Examiner*—Han Yang
(74) *Attorney, Agent, or Firm*—McDermott Will & Emery LLP

(57) ABSTRACT

The present invention provides a semiconductor memory device adjusting a bit line over driving period according to a power supply voltage level. A semiconductor memory device for stabilizing a bit line sense amplifier (hereinafter, referred as BLSA) includes the BLSA operated by a sense amplifier driving voltage; and a controller for comparing a feedbacked sense amplifier driving voltage with a reference voltage to thereby control the sense amplifier driving voltage to the BLSA.

18 Claims, 11 Drawing Sheets

SEMICONDUCTOR MEMORY DEVICE

FIELD OF THE INVENTION

The present invention relates to a semiconductor memory device; and, more particularly, to a semiconductor memory device having a bit line over driving scheme and a method for stably supplying a driving voltage to a bit line sense amplifier thereof.

DESCRIPTION OF PRIOR ART

As a size of a semiconductor memory is decreased, a level of an internal voltage also becomes lower. Most semiconductor memories include an internal voltage generator generating various kinds of internal voltages for internal operations of the semiconductor memories. Among the various kinds of internal voltages, a semiconductor memory device using a bit line sense amplifier (hereinafter, referred as BLSA) such as a DRAM uses a core voltage for sensing a cell data.

After a word line selected by a row address is activated, data stored in a plurality of memory cell connected to the selected word line are transmitted to each corresponding bit line. Then, each BLSA senses and amplifies a voltage difference between each of bit line pairs. For performing the abovementioned operation, because millions of the BLSAs are operated at once, large amount of current is consumed. Meanwhile, it is hard to operate the large amount of the BLSAs in a short time by using the core voltage VCORE having a low voltage level.

To solve above mentioned problem, a power supply line for enabling the BLSA is driven by using an over driving method which uses a predetermined voltage higher than the core voltage VCORE at an initial operation of the BLSA. The initial operation is performed directly after the memory cell and the bit line shares an electric charge. Herein, the predetermined voltage according to the over driving method is usually a power supply voltage VDD.

FIG. 1 is a block diagram showing a partial circuit of a DRAM core.

As abovementioned, a BLSA is provided to amplify a data loaded on a bit line. Therefore, one BLSA is provided to every bit line pair. As a plurality of the memory cells are arranged in array form, a plurality of the BLSAs are arranged in array form.

FIG. 2 is a schematic circuit diagram describing the partial circuit of the DRAM core.

As shown, the BLSA is usually implemented using two PMOS transistors connected between the bit line pair BL and /BL and the pull up power supply line RTO and two NMOS transistors connected between the bit line pair BL and /BL and the pull down power supply line SB. Further, a memory cell provided with one NMOS transistor and one capacitor is placed between a bit line BL and a word line WL. Although, it is not shown in FIG. 2, a bit line separator, a bit line equalizer/precharger, and a column selector are located between the BLSA and the memory cell.

Meanwhile, the BLSA driver 15 includes a first and a second RTO drive PMOS transistors P1 and P2 and a SB drive NMOS transistor N1. The first RTO drive PMOS transistor P1 supplies the pull up power supply line RTO with the power supply voltage VDD in response to a first RTO drive control signal RTOEN0. The second RTO drive PMOS transistor P2 supplies the pull up power supply line RTO with the core voltage VCORE in response to a second RTO drive control signal RTOEN1. The SB drive NMOS transistor N1 supplies the pull down power supply line SB with a ground voltage VSS in response to a SB drive control signal SBEN.

Further, the BLSA 15 includes three NMOS transistors equalizing or precharging the pull up and the pull down power supply lines RTO and SB into a precharge voltage VBLP in response to a bit line equalize signal BLEQ when the BLSA is not operated.

Herein, the first and the second RTO drive control signals RTOEN0 and RTOEN1 are low active signals. However, if the first and the second RTO drive control signals RTOEN0 and RTOEN1 can also be high active signals the first and the second RTO drive PMOS transistors P1 and P2 is replaced into NMOS transistors.

FIG. 3 is a waveform demonstrating an operation of the DRAM core shown in FIG. 2.

As shown, the drive transistors P1, P2, and N1 of the BLSA driver 15 are turned off and the pull up and the pull down power supply lines RTO and SB are precharged with the precharge voltage VBLP in response to the activated bit line equalize signal BLEQ until an active command ACT is inputted.

After the active command ACT is inputted at a timing t0 and a predetermined time is passed, the word line WL is activated and the bit line equalize signal BLEQ becomes a logic level 'L' at a timing t1. At this time, the precharge voltage VBLP is not supplied to the pull up and the pull down power supply lines RTO and SB. When the word line WL is activated, the data stored in the memory cell is loaded into the bit line pair BL and /BL through a charge sharing operation. After a predetermined time, i.e., at a timing t2, the first RTO drive control signal RTOEN0 is activated as a logic level 'L' and the SB drive control signal SBEN is activated as a logic level 'H'. Then, the pull up power supply line RTO is supplied with the power supply voltage VDD by the first RTO drive PMOS transistor P1; the pull down power supply line SB is supplied with the ground voltage VSS by the SB drive NMOS transistor N1.

After a predetermined over driving time is passed, the first RTO drive control signal RTOEN0 is inactivated as a logic level 'H' and the second RTO drive control signal RTOEN1 is activated as a logic level 'L' at a timing t3. Then, the pull up power supply line RTO is supplied with the core voltage VCORE by the second RTO drive control drive PMOS transistor P2.

Meanwhile, after the timing t3, the column selector is activated to thereby transfer the data amplified by the BLSA into a data bus and restore the amplified data into the memory cell. Although not shown in FIG. 3, after a precharge command is inputted, the bit line pair BL and /BL, the pull up power supply line RTO, and the pull down power supply line SB are precharged into the precharge voltage VBLP.

In the abovementioned driving method for the BLSA, an over driving period, i.e., from timing t2 to timing t3, is determined by a delay logic block. Therefore, an over driving operation is forced to be performed during a predetermined fixed time.

FIG. 4 is a block diagram describing an RTO drive control signal generation block for use in a conventional semiconductor memory device.

As shown, the RTO drive control signal generation block includes a delay circuit 40, an RTO drive control signal generator 45, and a first and a second drive NMOS transistors MN0 and MN1. The delay circuit 40 receives a BLSA enable signal SAEN to output an over driving enable signal OVDEN. The RTO drive control signal generator 45 receives the BLSA enable signal SAEN and the over driving enable signal OVDEN to generate the first and the second RTO drive control signals RTOEN0 and RTOEN1. The first drive NMOS transistor MN0 supplies the pull up power supply line RTO with the power supply voltage VDD in response to the first RTO drive control signal RTOEN0. The second drive NMOS transistor MN1 supplies the pull up power supply line RTO into the core voltage VCORE in response to the second RTO drive control signal RTOEN1. Herein, the NMOS transistors are used for driving the pull up power supply line RTO, contrary to the case of FIG. 2.

FIG. 5A is a waveform demonstrating an operation of the RTO drive control signal generation block shown in FIG. 4.

As shown, when the BLSA enable signal SAEN is activated into a logic level 'H', the delay circuit 40 generates the over driving enable signal OVDEN in response to the BLSA enable signal SAEN. The over driving enable signal OVDEN is activated into a logic level 'H' for a predetermined time after the BLSA enable signal SAEN is activated. Also, the RTO drive control signal generator 45 generates the first and the second drive control signal RTOEN0 and RTOEN1 according to levels of the BLSA enable signal SAEN and the over driving enable signal OVDEN. When the BLSA enable signal SAEN and the over driving enable signal OVDEN are in the logic level 'H', the first RTO drive control signal RTOEN0 is activated as the logic level 'H'. Meanwhile, when the BLSA enable signal SAEN is in the logic level 'H' and the over driving enable signal OVDEN is in a logic level 'L', the second RTO drive control signal RTOEN1 is activated. That is, the over driving period is defined by the over driving enable signal OVDEN.

Referring to FIG. 4, the delay circuit 40 can be simply implemented with a pulse generator including a delay D. A length of the over driving period is determined by a delay time of the delay D in the delay circuit 40.

FIGS. 5B and 5C are waveforms showing voltage levels of the pull up power supply line RTO and the bit line BL according to a level of the power supply voltage VDD.

In case of FIG. 5B, a level of a low power supply voltage VDD_L is relatively lower than VDD level. The delay time of the delay D in the conventional RTO drive control signal generation block shown in FIG. 4 is determined based on the low power supply voltage VDD_L. Therefore, the over driving operation is properly performed under the low power supply voltage VDD_L circumstance.

However, when a level of a power supply voltage is relatively high as shown in FIG. 5C, the over driving operation is performed excessively; and, therefore, the bit line BL is excessively charged. An excessive electric charge of the bit line BL flows back to a core voltage terminal through the second drive NMOS transistor MN1. In FIG. 5C, '$V_A$' denotes an amount of the excessive electric charge of the bit line BL caused by the excessive over driving operation. Herein, the power supply voltage which is relatively higher than VDD is referred as a high power supply voltage VDD_H.

When the excessive electric charge flows back to the core voltage terminal, a level of the core voltage VCORE becomes unstable. In order to make the level of the core voltage VCORE be stable, a circuit for discharging the excessive electric charge quickly is additionally required. However, as a result, the circuit substantially wastes a current. Moreover, when the BLSA is repeatedly driven, the problems above-mentioned are further deepened.

Meanwhile, if the over driving period is reduced to prevent the excessive over driving operation, e.g., under the low power supply voltage VDD_L, the bit line BL is amplified too slowly. As a result, it is very hard to appropriately determine an over driving period in the conventional RTO drive control signal generation block.

SUMMARY OF INVENTION

It is, therefore, an object of the present invention to provide a semiconductor memory device adjusting a bit line over driving period according to a power supply voltage level.

In accordance with an aspect of the present invention, there is provided a semiconductor memory device for stabilizing a bit line sense amplifier (hereinafter, referred as BLSA) including the BLSA operated by a sense amplifier driving voltage; and a controller for comparing a feedbacked sense amplifier driving voltage with a reference voltage to thereby output the sense amplifier driving voltage to the BLSA.

In accordance with another aspect of the present invention, there is provided a method for stably supplying a driving voltage to a BLSA including: comparing a feedbacked sense amplifier driving voltage with a reference voltage to thereby output a sense amplifier driving voltage; and operating the BLSA by using the sense amplifier driving voltage.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor memory device in accordance with the present invention will be described in detail referring to the accompanying drawings.

Figure 1:
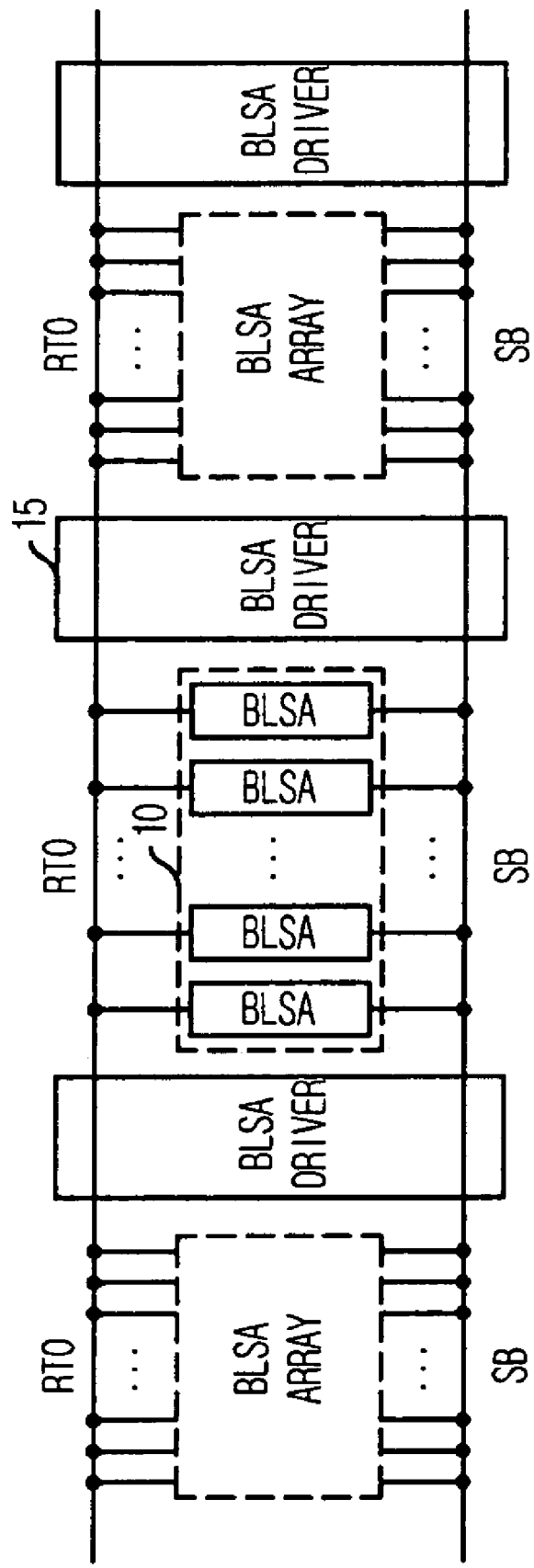
FIG. 1 is a block diagram showing a partial circuit of a DRAM core.
Figure 2:
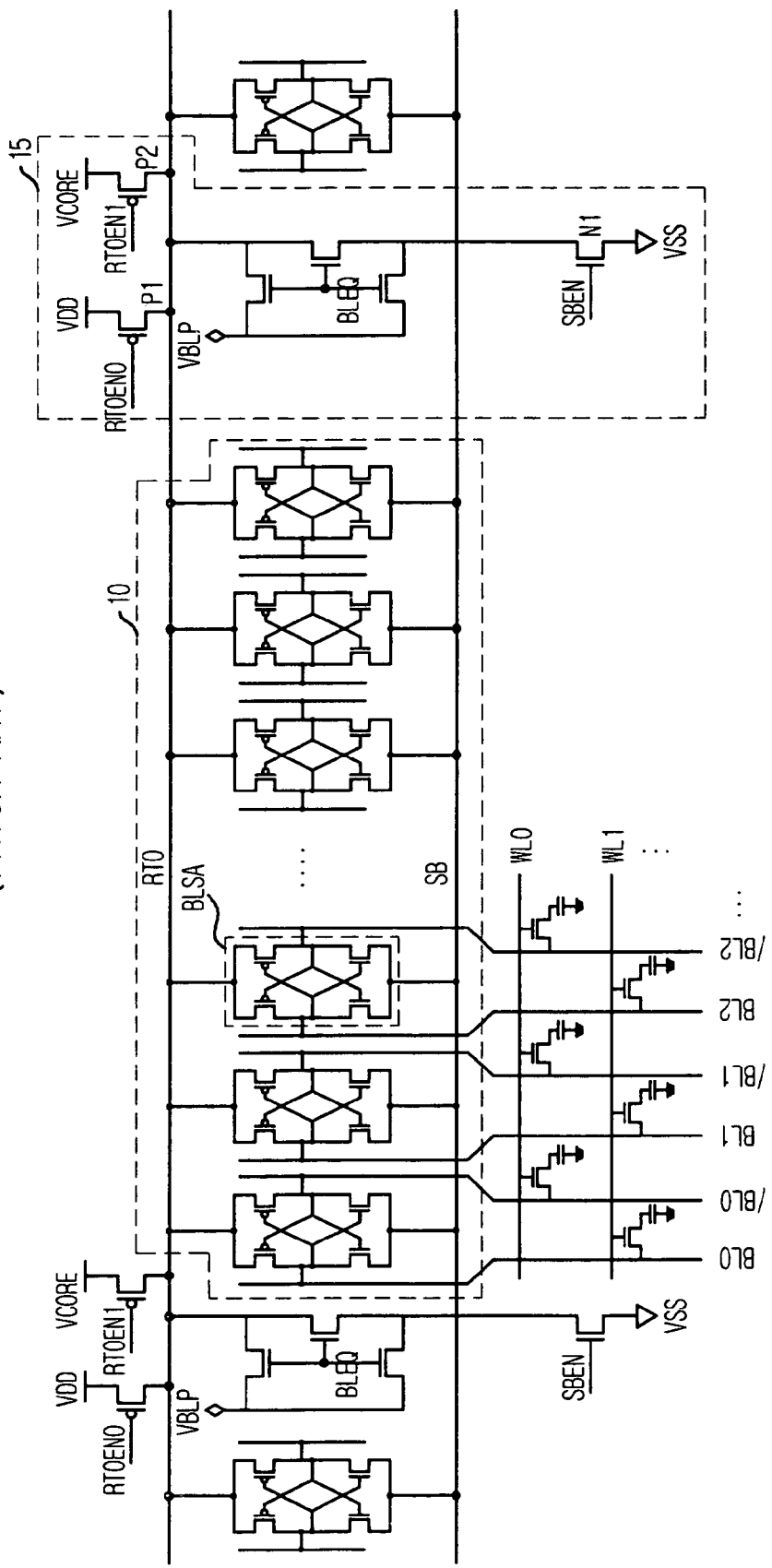
FIG. 2 is a schematic circuit diagram describing the partial circuit of the DRAM core.
Figure 3:
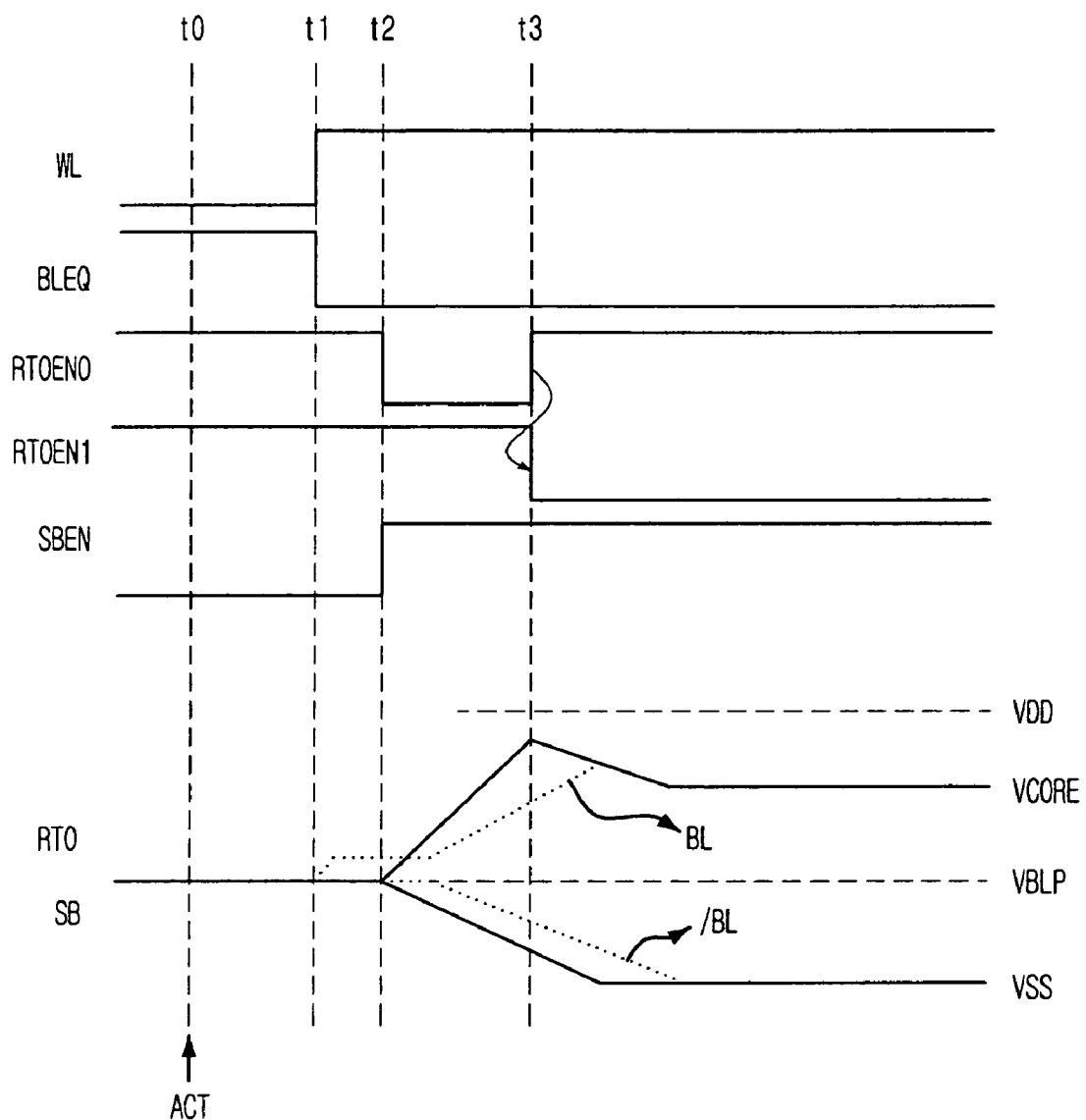
FIG. 3 is a waveform demonstrating an operation of the DRAM core shown in FIG. 2.
Figure 4:
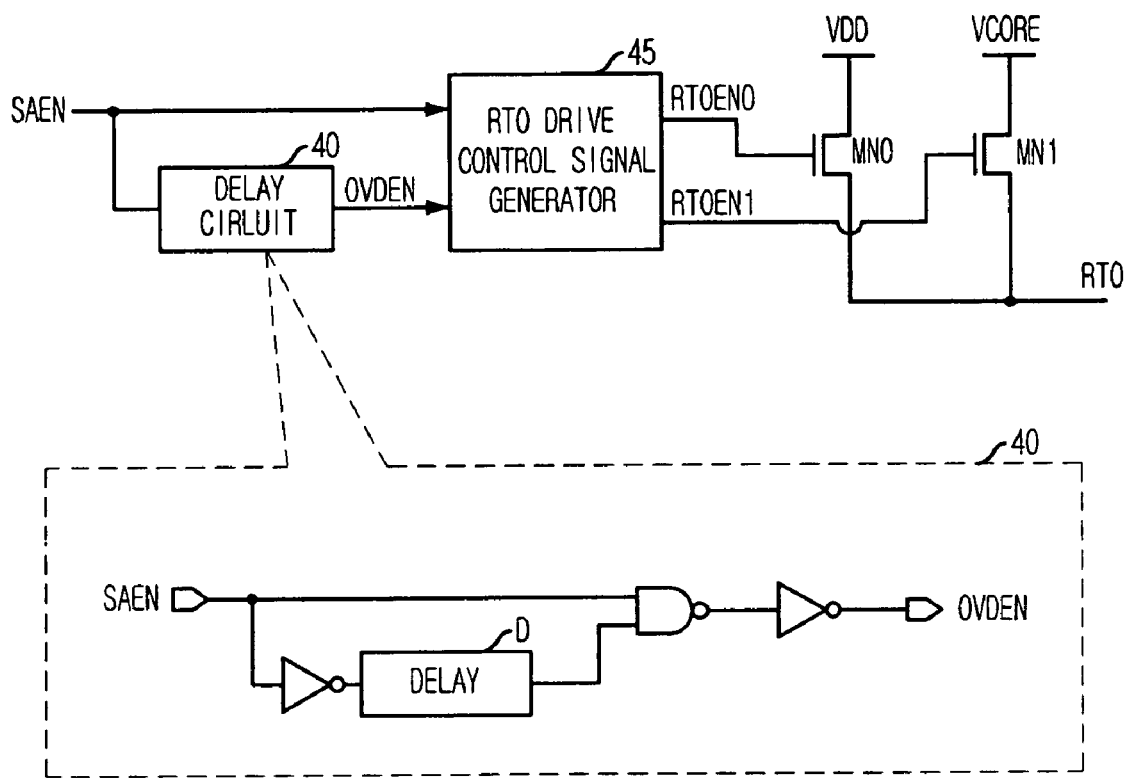
FIG. 4 is a block diagram describing an RTO drive control signal generation block in accordance with a conventional art.
Figure 5A:
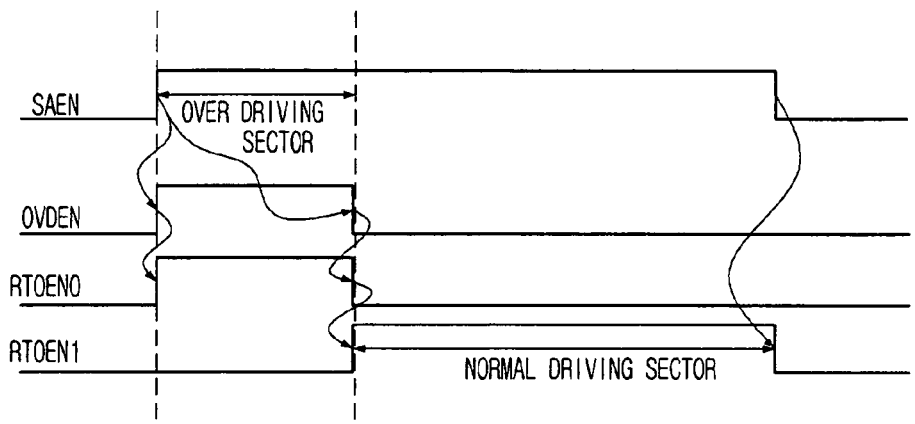
FIG. 5A is a waveform demonstrating an operation of the RTO drive control signal generation block shown in FIG. 4.
Figure 5B:
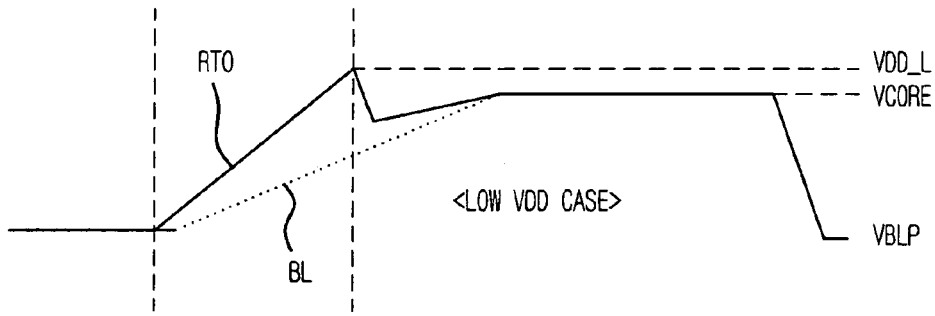
FIGS. 5B and 5C are waveforms showing voltage levels of a pull up power supply line and a bit line according to a level of the power supply voltage.
Figure 5C:
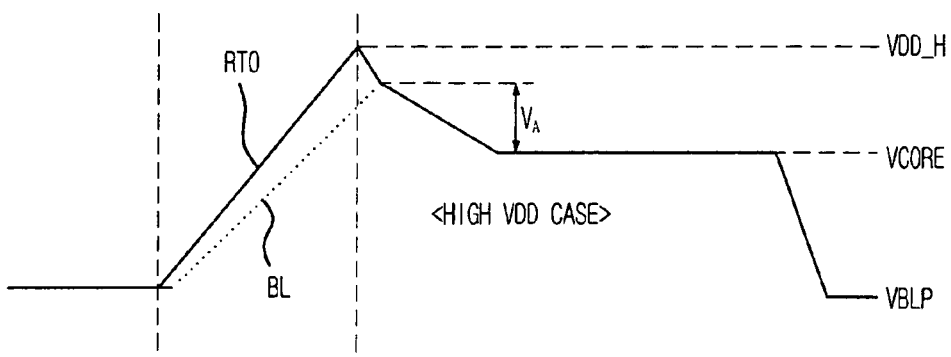
Figure 6:
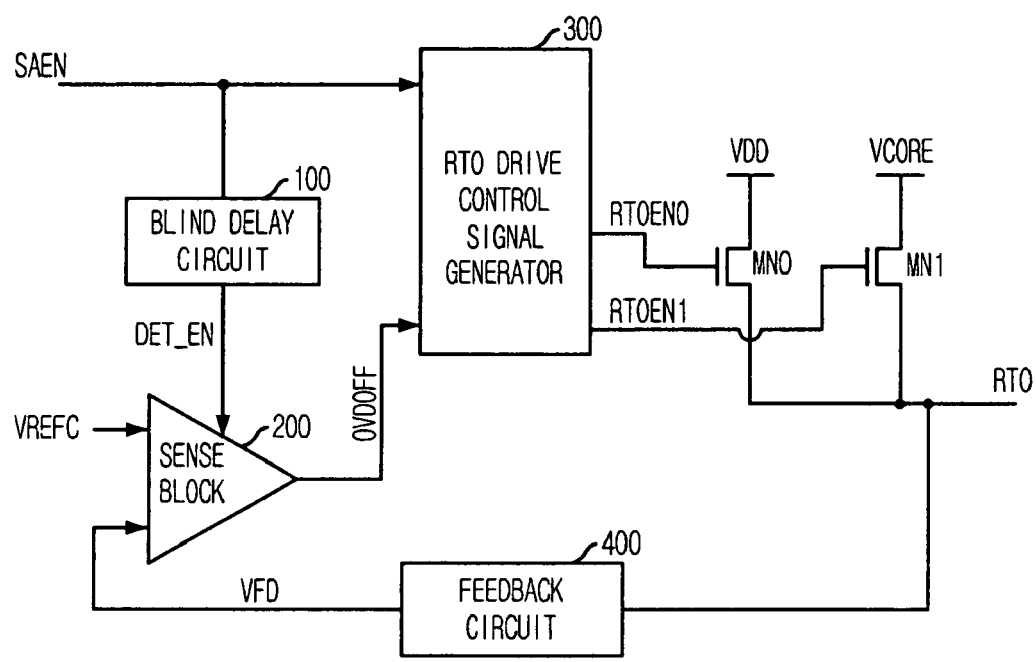
FIG. 6 is a block diagram describing an RTO drive control signal generation block in accordance with a preferred embodiment of the present invention.

FIG. 6 is a block diagram describing an RTO drive control signal generation block in accordance with a preferred embodiment of the present invention.

As shown, the RTO drive control signal generation block includes a blind delay circuit 100, a sense block 200, a RTO drive control signal generator 300, and a feedback circuit 400.

The blind delay circuit 100 delaying a bit line sense amplifier (hereinafter, referred as BLSA) enable signal SAEN outputs a detection enable signal DET_EN. The sense block 200 compares a reference voltage VREFC with a feedback voltage VFD to output an over driving off signal OVDOFF in response to the detection enable signal DET_EN. The RTO drive control signal generator 300 outputs a first and a second RTO drive control signal RTOEN0 and RTOEN1 in response to the BLSA enable signal SAEN and the over driving off signal OVDOFF. Herein, a level of the reference voltage VREFC has a half level of a core voltage VCORE.

The RTO drive control signal generation block further includes a first and a second drive NMOS transistors MN0 and MN1. The first drive NMOS transistor MN0 supplies a pull up power supply line RTO with a power supply voltage VDD in response to the first RTO drive control signal RTOEN0. The second drive NMOS transistor MN1 supplies the pull up power supply line RTO with the core voltage VCORE in response to the second RTO drive control signal RTOEN1.

Further, the feedback circuit 400 receiving a predetermined voltage, such as VDD or VCORE, loaded in the pull up power supply line RTO generates the feedback voltage VFD indicating a state of the bit line BL.

Figure 7:
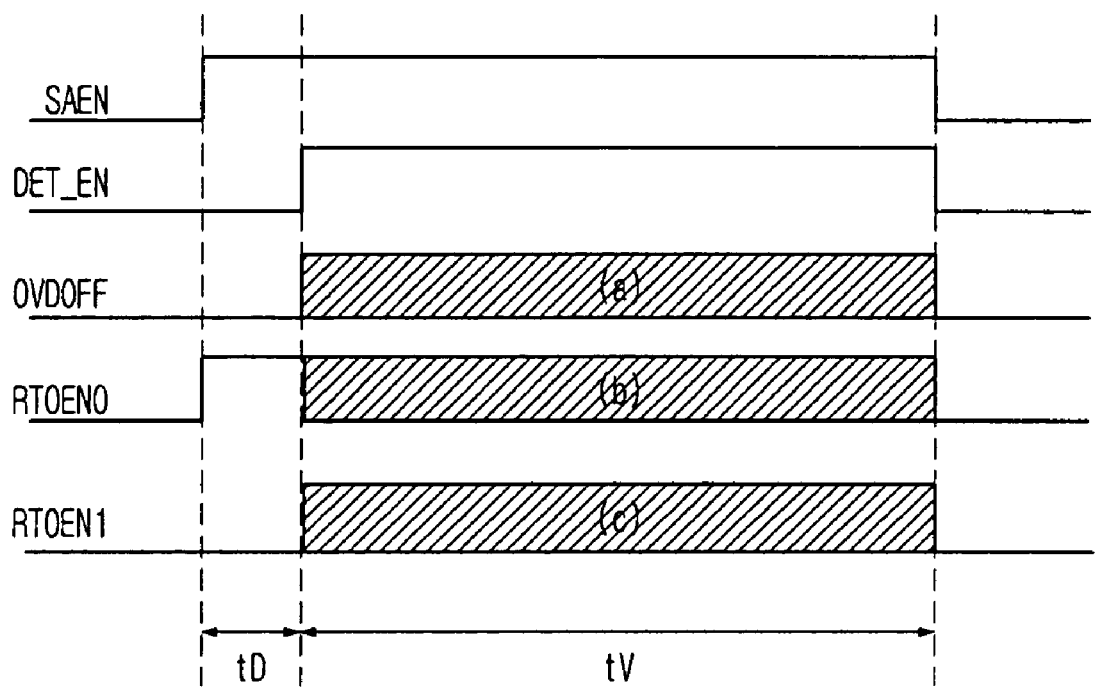
FIG. 7 is a waveform demonstrating an operation of the RTO drive control signal generation block shown in FIG. 6.

FIG. 7 is a waveform demonstrating an operation of the RTO drive control signal generation block shown in FIG. 6.

As shown, after an active command ACT is inputted, when the BLSA enable signal SAEN is activated into a logic level 'H', the RTO drive control signal 300 activates the first RTO drive control signal RTOEN0 into a logic level 'H'.

At an initial operation of the BLSA, i.e., directly after the memory cell and the bit line shares an electric charge, the blind delay circuit 100 starts an over driving operation during a predetermined time tD in response to the first RTO drive control signal RTOEN0. That is, the pull up power supply line RTO is supplied with a power supply voltage VDD without enabling the sense block 200 during the predetermined time tD. Hereinafter, the predetermined time tD is referred as a blind over driving period tD because the over driving operation should be performed in this period.

The sense block 200 is not operated during the blind over driving period tD to thereby ensure a stable operation of the RTO drive control signal generation block. That is, if the sense block is operated from the beginning, there exist a possibility that the over driving operation is not performed. The length of the blind over driving period tD can be adjustable according to the sense block 200 and the feedback circuit 400.

After the blind over driving period tD, the detection enable signal DET_EN is activated as a logic level 'H'. Then, the sense block 200 starts to compare the reference voltage VREFC with the feedback voltage VFD in response to the detection signal DET_EN. If a level of the feedback voltage VFD is lower than that of the reference voltage VREFC, a level of the over driving off signal OVDOFF becomes a logic level 'L'. On the contrary, when the level of the feedback voltage VFD is higher than that of the reference voltage, the over driving off signal OVDOFF becomes a logic level 'H'.

The RTO drive control signal generator 300 inactivates the first RTO drive control signal RTOEN0 as a logic level 'L' in response to the over driving off signal OVDOFF having the logic level 'H' and, concurrently, activates the second RTO drive control signal RTOEN1 as a logic level 'H'. Therefore, the pull up power supply line RTO is supplied with the core voltage VCORE.

Next, when the BLSA enable signal SAEN is inactivated as a logic level 'L', the core voltage VCORE is not supplied to the pull up power supply line RTO. The pull up power supply line RTO is precharged with a precharge voltage VBLP.

Meanwhile, an over driving period is determined based on an operation of the sense block 200 and, therefore, can be adjustable. A variable over driving period tV is corresponding to a period from a timing of activating the detection enable signal DET_EN and to a timing of deactivating the BLSA enable signal SAEN. Therefore, the total length of the over driving period is (tD+tV). Each of (a), (b), and (c) periods shown in FIG. 7 is variable in response to the over driving off signal OVDOFF and the first and the second RTO drive control signals RTOEN0 and RTOEN1, respectively.

Figure 8:
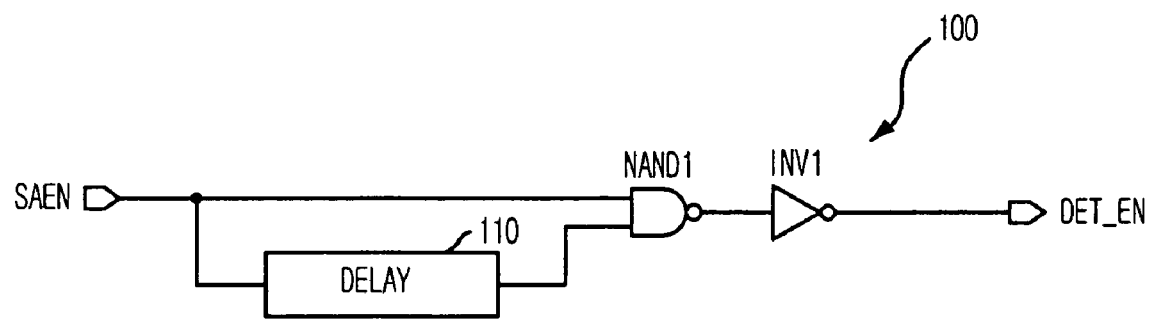
FIG. 8 is a schematic circuit diagram depicting a blind delay circuit shown in FIG. 6.

FIG. 8 is a schematic circuit diagram depicting the blind delay circuit 100 shown in FIG. 6.

As shown, the blind delay circuit 100 includes a delay 110, a first NAND gate NAND1, and a first inverter INV1. The delay 110 delays the BLSA enable signal SAEN for a predetermined time. The first NAND gate NAND1 receives the BLSA enable signal SAEN and a delayed BLSA enable signal outputted from the delay 110. The first inverter INV1 receives an output from the first NAND gate NAND1 to output detection enable signal DET_EN.

Herein, the blind delay circuit 100 is implemented with a pulse generator. As abovementioned, the blind delay circuit 100 outputs the detection enable signal DET_EN determining the variable over driving period tV.

Figure 9:
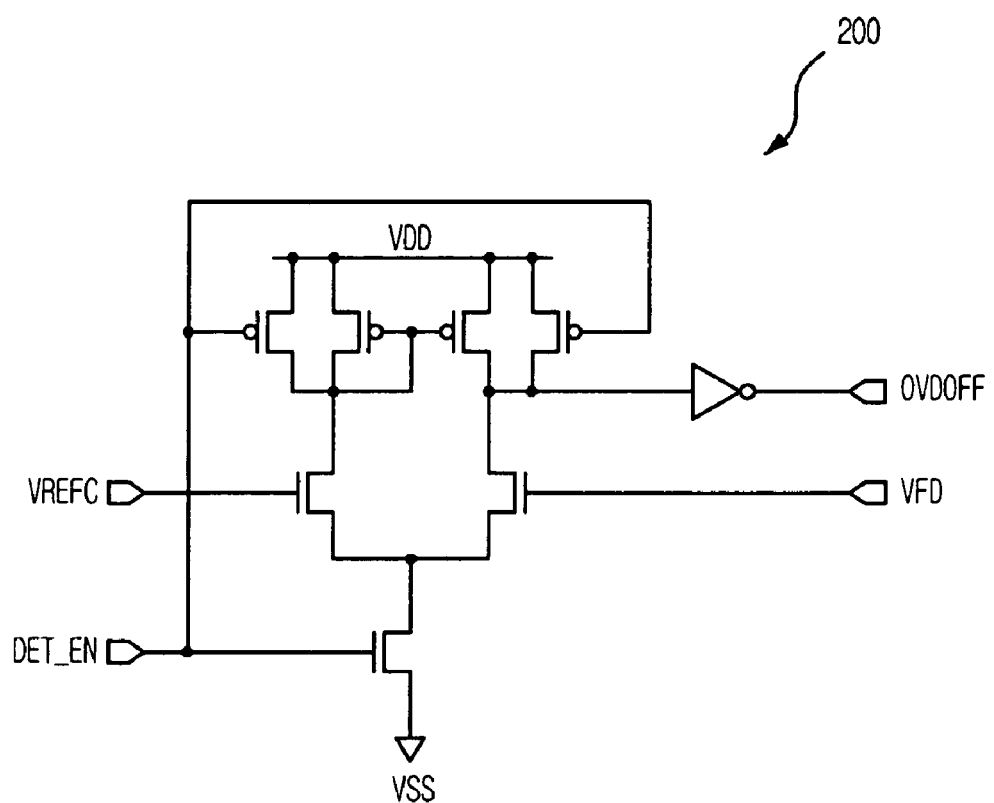
FIG. 9 is a schematic circuit diagram depicting a sense block shown in FIG. 6.

FIG. 9 is a schematic circuit diagram depicting the sense block 200 shown in FIG. 6.

As shown, the sense block 200 is implemented with a differential amplifier receiving the reference VREFC and the feedback voltage VFD. The differential amplifier shown in FIG. 9 is an NMOS type differential amplifier including a bias transistor. The bias transistor is connected to a ground voltage VSS and controlled by the detection enable signal DET_EN.

As abovementioned, the sense block 200 is enabled in response to the detection signal DET_EN. If the level of the feedback voltage VFD is lower than that of the reference voltage VREFC, the sense block 200 outputs the over driving off signal OVDOFF having the logic level 'L'. On the contrary, when the level of the feedback voltage VFD is higher than that of the reference voltage, the sense block 200 outputs the over driving off signal OVDOFF having the logic level 'H'.

Figure 10:
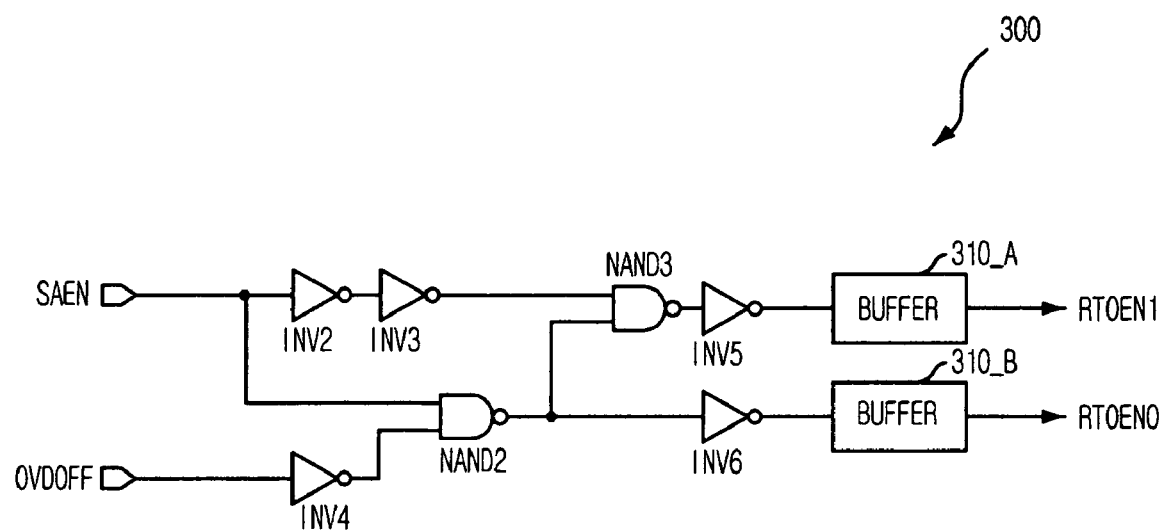
FIG. 10 is a schematic circuit diagram describing a RTO drive control signal generator shown in FIG. 6.

FIG. 10 is a schematic circuit diagram describing the RTO drive control signal generator 300 shown in FIG. 6.

As shown, the RTO drive control signal generator 300 is provided with five inverters INV2 to INV6, two NAND gates NAND2 and NAND3, and two buffers 310_A and 310_B.

The buffers 310_A and 310_B perform a boosting operation as well as a usual buffering operation to thereby improve a slew rate occurred when the pull up power supply line RTO is driven by the first and the second RTO drive control signals RTOEN0 and RTOEN1.

Figure 11:
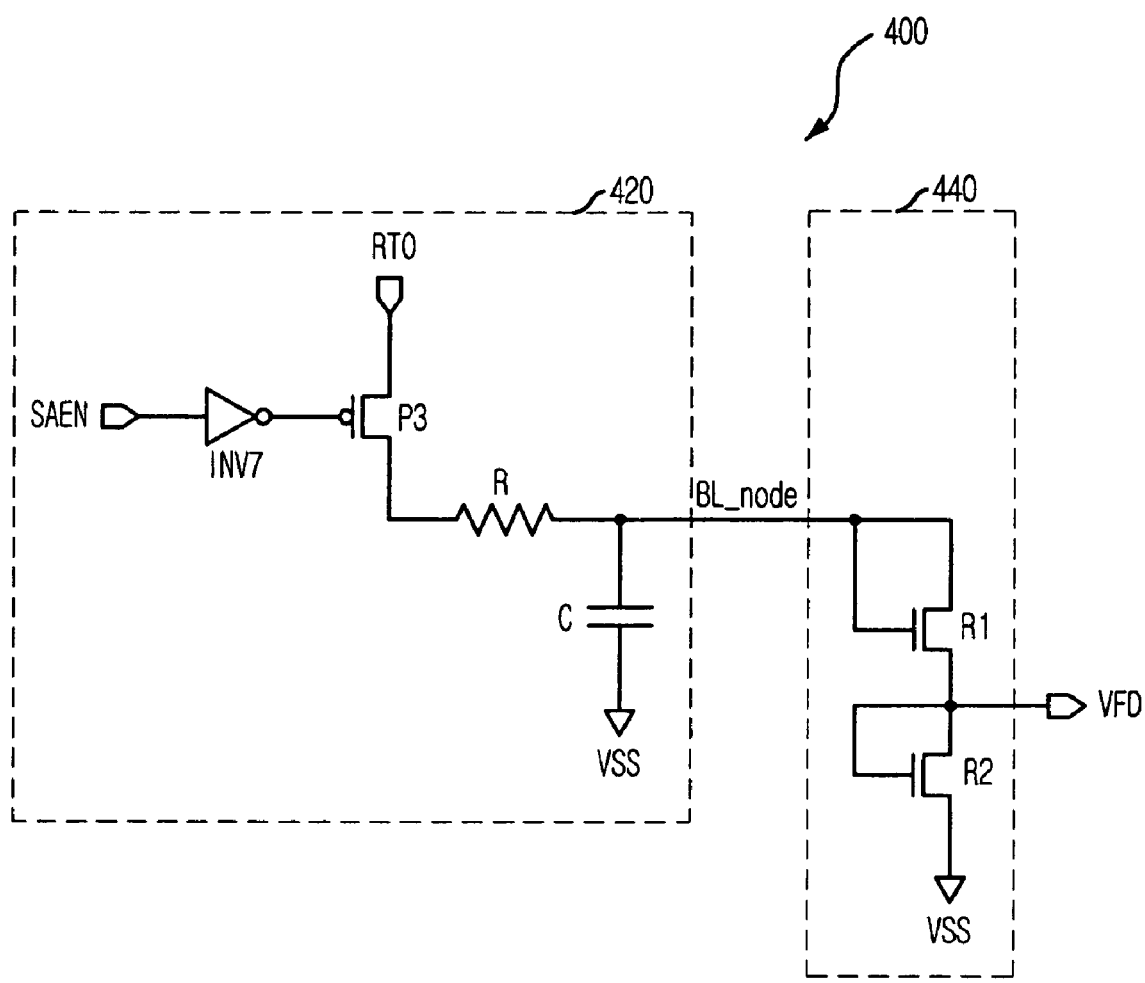
FIG. 11 is a schematic circuit diagram showing a feedback circuit shown in FIG. 6.

FIG. 11 is a schematic circuit diagram showing the feedback circuit 400 shown in FIG. 6.

As shown, the feedback circuit 400 includes a bit line model circuit 420 and a voltage divider 440. The bit line model circuit 420 is for reflecting a bit line parasitic element to the pull up power supply line RTO. The voltage divider 440 divides an output voltage of the bit line model circuit 420 to thereby output the feedback voltage VFD.

The bit line model circuit 420 is provided with a seventh inverter INV7, a replica drive PMOS transistor P3, a resistor R, and a capacitor C. The resistor R and the capacitor C form an RC replica for modeling a bit line parasitic element. The seventh inverter INV7 receives the BLSA enable signal SAEN. The replica drive PMOS transistor P3 drives the RC replica by including the voltage loaded in the pull up power supply line RTO in response to an output of the seventh inverter INV7.

The voltage divider 440 contains a first and a second resistors R1 and R2 serially connected to each other between a bit line node BL_node and the ground voltage VSS. As shown in FIG. 11, the first and the second resistors R1 and R2 can be implemented by using diode-connected NMOS transistors, respectively. When resistance of the first and the second resistors R1 and R2 are equivalent, the level of the feedback voltage VFD becomes a half of a voltage loaded in the bit line node BL_node. It is also possible to set up the feedback voltage VFD as a predetermined level required by an adjusted resistance ratio of the first and the second resistors R1 and R2.

The bit line model circuit 420 outputs the voltage loaded in the pull up power supply line RTO after passing through the replica drive PMOS transistor P3 and the RC replica to thereby accurately reflect the state of the bit line BL. The state of the bit line BL is affected by both a pull up driving capacity of the BLSA and the bit line parasitic element. The pull up driving capacity of the BLSA is modeled by the replica drive PMOS transistor P3; and the bit line parasitic element is modeled by the RC replica. Because the bit line parasitic element in one bit line BL can be varied according to a distance from the pull up power supply line RTO, the RC replica can be modeled by properly choosing the resistor R and the capacitor C.

Meanwhile, because the sense block 200 receives the reference voltage having VCORE/2, the voltage divider 440 divides the voltage loaded in the bit line node BL_node in half. If the voltage divider 440 is not used, i.e., the feedback circuit 400 outputs the voltage loaded in the bit line node BL_node, the sense block 200 receives the core voltage VCORE as the reference voltage VREFC.

Figure 12:
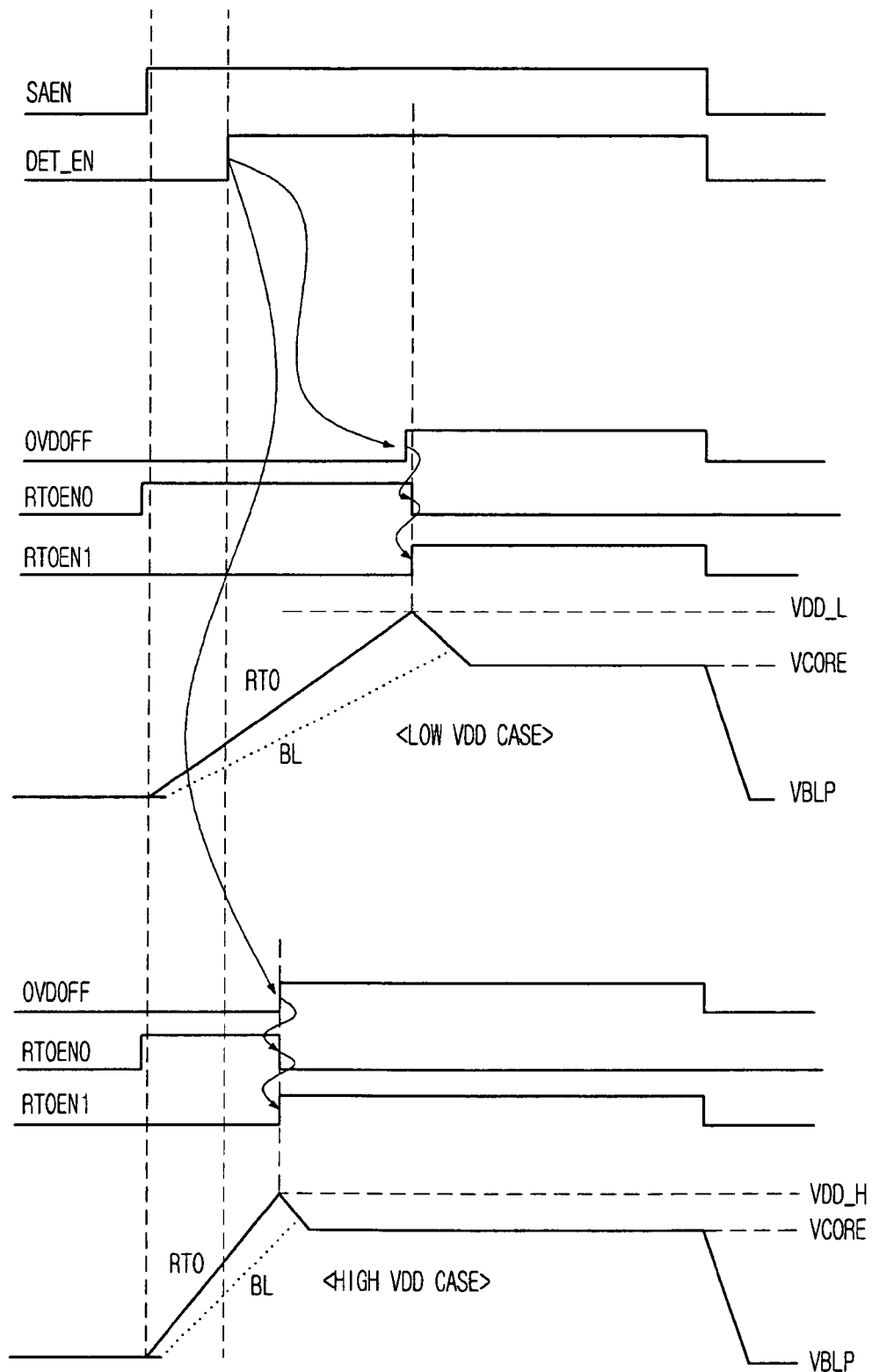
FIG. 12 is a waveform demonstrating an operation of the RTO drive control signal generation block shown in FIG. 6.

FIG. 12 is a waveform demonstrating an operation of the RTO drive control signal generation block shown in FIG. 6.

As shown, when the BLSA enable signal SAEN is activated as a logic level 'H', the first RTO drive control signal RTOEN0 is activated as a logic level 'H'. The over driving operation is performed during the blind over driving period tD in response to the first RTO drive control signal RTOEN0. Because of the over driving operation performed during the blind over driving period tD, the level of the pull up power supply line RTO is increased to a predetermined level.

Meanwhile, at a timing where the blind over driving period tD is ended, the detection signal DET_EN is activated as a logic level 'H' and, therefore, the sense block 200 is operated to thereby start a variable over driving operation. Herein, the variable over driving operation is performed during the variable over driving operation period tV. Further, a certain amount of delay caused by the sense block 200 and the feedback circuit 400 can be between the timing where the blind over driving period tD is ended and a timing where the detection signal DET_EN is activated.

Generally, at a timing where the blind over driving period tD is over, the voltage level of the bit line BL is lower than the level of the core voltage VCORE. Also, a level of the feedback voltage VFD is lower than a level of the reference voltage. Therefore, the over driving operation is continuously performed. Then, the voltage levels of the pull up power supply line RTO and the bit line BL keeps increasing and, finally, the level of the feedback voltage VFD becomes higher than the level of the reference voltage VREFC. Thus, the over driving off signal OVDOFF becomes a logic level 'H'.

Cases (b) and (c) of FIG. 12 show waveforms demonstrating voltage levels of the pull up power supply line RTO and the bit line BL according to a level of the power supply voltage.

Comparing (b) with (c) of FIG. 12, the voltage level of the pull up power supply line RTO is slowly increased under a low power supply voltage VDD_L. Therefore, it takes relatively more time for the voltage level of the bit line BL to be increased to the level of the core voltage VCORE. Meanwhile, increasing the voltage level of the pull up power supply line RTO to the level of the core voltage VCORE takes relatively less time.

As a result, the RTO drive control signal generation block of the present invention provides the over driving operation period adjusted according to the level of the power supply voltage VDD. The over driving off signal OVDOFF outputted from the sense block 200 decides the variable over driving period tV.

In the abovementioned embodiment, NMOS transistors MN0 and MN1 are used for driving the pull up power supply line RTO. However, other kinds of transistors can be used instead of the NMOS transistors MN0 and MN1. Further, kinds and locations of logic gates and transistors should be changed according to input signals.

Still further, in the abovementioned embodiment, an over driver MN0 and a normal driver MN1, for respectively supplying the pull up power supply line RTO with the power supply voltage VDD and the core voltage VCORE, are coupled to the pull up power supply line RTO. However, in another embodiment, the over driver only controls the core voltage VCORE terminal to thereby indirectly control the pull up power supply line RTO.

Moreover, the present invention could possible to use other voltages instead of the power supply voltage VDD for the over driving operation and the core voltage VCORE for a normal driving operation because all kinds of voltages used inside of the semiconductor memory device are derived from the power supply voltage VDD.

As abovementioned, the RTO drive control signal generation block of the present invention receives the feedback voltage VREFC indicating the state of the bit line BL to thereby determine the length of the over driving period. Thus, the present invention properly performs the over driving operation according to the level of the power supply voltage VDD.

That is, in case of the low power supply voltage VDD_L circumstance, the present invention provides the relatively long controllable over driving period tV to thereby increase the voltage level of the bit line BL sufficiently. Meanwhile, the variable over driving period tV of the high power supply voltage VDD_H is relatively short, as compared with that of the low power supply voltage VDD_L. Therefore, it is prevented that the bit line BL is excessively charged and an excessive electric charge of the bit line BL flows back to the core voltage VCORE terminal.

The present application contains subject matter related to Korean patent application No. 2005-36593, filed in the Korean Patent Office on Apr. 30, 2005, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device for stabilizing a bit line sense amplifier (BLSA), comprising:

a blind delay unit for delaying a BLSA enable signal for a predetermined time to thereby output a detection signal;

a sensing unit for comparing a reference voltage and a feedbacked sense amplifier driving voltage to thereby output an over driving off signal in response to the detection signal;

a drive control signal generating unit for generating a first and a second drive control signal in response to the BLSA enable signal and the over driving off signal;

a drive circuit for driving a BLSA pull up power supply line in response to the first and the second drive control signals; and a feedback circuit for receiving a voltage of the BLSA pull up power supply line to thereby generate the feedbacked sense amplifier driving voltage.

2. The semiconductor memory device as recited in claim 1, wherein the BLSA pull up power supply line is driven by of a normal driving voltage and an over driving voltage selected in response to the first and the second drive control signals.

3. The semiconductor memory device as recited in claim 2, wherein the drive circuit includes:
a first driver for driving the BLSA pull up power supply line with the over driving voltage in response to the first drive control signal; and
a second driver for driving the BLSA pull up power supply line into the normal driving voltage in response to the second drive control signal.

4. The semiconductor memory device as recited in claim 3, wherein the normal driving voltage is a core voltage; and the over driving voltage is a power supply voltage.

5. The semiconductor memory device as recited in claim 4, wherein the first driver is a first NMOS transistor, the first NMOS transistor connected between the power supply voltage and the BLSA pull up power supply line and receiving the first drive control signal through a gate thereof.

6. The semiconductor memory device as recited in claim 5, wherein the second driver is a second NMOS transistor connected between the core voltage and the BLSA pull up power supply line and receiving the second drive control signal through a gate thereof.

7. The semiconductor memory device as recited in claim 4, wherein the sensor includes a differential amplifier receiving the reference voltage and the feedbacked sense amplifier driving voltage, the differential amplifier enabled in response to the detection signal.

8. The semiconductor memory device as recited in claim 7, wherein the feedback circuit includes a bit line model circuit for reflecting a bit line parasitic element to the voltage of the BLSA pull up power supply line.

9. The semiconductor memory device as recited in claim 8, wherein the reference voltage is the core voltage.

10. The semiconductor memory device as recited in claim 9, wherein the bit line model circuit includes:
a RC replica formed with a resistor and a capacitor, the RC replica for modeling the bit line parasitic element;
a MOS transistor for driving the RC replica by using the voltage of the BLSA pull up power supply line in response to the BSLA enable signal.

11. The semiconductor memory device as recited in claim 8, wherein the feedback circuit further includes a voltage divider for dividing an output voltage of the bit line model circuit to thereby output the feedback voltage.

12. The semiconductor memory device as recited in claim 11, wherein a level of the reference voltage has a half level of the core voltage.

13. The semiconductor memory device as recited in claim 12, wherein the voltage divider is provided with a first and a second resistors serially connected each other, the first and the second resistors having the same resistance and being implemented with a MOS transistor respectively.

14. The semiconductor memory device as recited in claim 4, wherein the blind delay includes:
a delay receiving the BLSA enable signal;
a NAND gate receiving an output of the delay and BLSA enable signal; and
an inverter receiving an output of the NAND gate.

15. The semiconductor memory device as recited in claim 4, wherein the drive control signal generator includes:
a first AND gate for logically multiplying the BLSA enable signal and the over driving off signal; and
a second AND gate for logically multiplying the BLSA enable signal and an output of the first AND gate.

16. The semiconductor memory device as recited in claim 4, wherein the drive control signal generator includes:
a first inverter receiving the BLSA enable signal;
a second inverter receiving an output from the first inverter;
a third inverter receiving the over driving off signal;
a first NAND gate receiving an output of the third inverter and BLSA enable signal;
a second NAND gate receiving an output of the first NAND gate and second inverters;
a fourth inverter receiving an output of the second NAND gate;
a fifth inverter receiving the output of the first NAND gate;
a first buffer for buffering an output of the fourth inverter to thereby output the second drive control signal; and
a second buffer for buffering an output of the fifth inverter to thereby output the first drive control signal.

17. Methed A method for stably supplying a driving voltage to a bit line sense amplifier (BLSA), comprising:
delaying a BLSA enable signal for a predetermined fixed timing to thereby output a detection signal;
comparing a feedbacked sense amplifier driving voltage with a reference voltage to thereby output an over driving off signal in response to the detection signal;
generating a first and a second drive control signals in response to the BLSA enable signal and the over driving off signal, respectively;
driving a BLSA pull up power supply line in response to the first and the second drive control signals;
operating the BLSA by driving the BLSA pull up power supply line; and
receiving a voltage of the BLSA pull up power supply line to generating the feedback sense amplifier driving voltage.

18. The method as recited in claim 17, wherein the BLSA pull up power supply line is driven by one of a normal driving voltage and an over driving voltage selected by the first and the second drive control signals.

* * * * *